(12) United States Patent
Zhang et al.

(10) Patent No.: US 11,127,136 B2
(45) Date of Patent: Sep. 21, 2021

(54) SYSTEM AND METHOD FOR DEFINING FLEXIBLE REGIONS ON A SAMPLE DURING INSPECTION

(71) Applicant: KLA Corporation, Milpitas, CA (US)

(72) Inventors: Yong Zhang, Cupertino, CA (US); Tao Luo, Fremont, CA (US); Jie Gong, San Jose, CA (US); Premchandra M. Shankar, Fremont, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/901,102

(22) Filed: Jun. 15, 2020

(65) Prior Publication Data

US 2021/0174483 A1 Jun. 10, 2021

Related U.S. Application Data

(60) Provisional application No. 62/944,118, filed on Dec. 5, 2019.

(51) Int. Cl.
*G01N 21/95* (2006.01)
*G01N 21/956* (2006.01)
(Continued)

(52) U.S. Cl.
CPC ......... *G06T 7/001* (2013.01); *G01N 21/9501* (2013.01); *G01N 21/95607* (2013.01);
(Continued)

(58) Field of Classification Search
CPC .......... G06T 7/001; G06T 2207/30148; G01N 21/9501; G01N 21/95607; G03F 1/84; H01L 22/12
(Continued)

(56) References Cited

U.S. PATENT DOCUMENTS 6,614,924 B1 9/2003 Aghajan
2003/0050761 A1 3/2003 Okabe et al.
(Continued)

FOREIGN PATENT DOCUMENTS

KR 1020180061556 A 6/2018

OTHER PUBLICATIONS

U.S. Appl. No. 62/944,118, filed Dec. 5, 2019, Zhang et al.
(Continued)

*Primary Examiner* — Isiaka O Akanbi
(74) *Attorney, Agent, or Firm* — Suiter Swantz pc llo

(57) ABSTRACT

A system for defining flexible regions on a sample is disclosed. The system includes an inspection system configured to acquire one or more swath images. The system includes a controller communicatively coupled to the inspection system, the controller configured to: generate one or more median reference die (MRD) images based on the one or more swath images; generate one or more flexible region masks based on the one or more MRD images; identify a set of alignment sites on the one or more flexible region masks based on one or more coordinates of the one or more MRD images; perform patch-to-mask alignment between the one or more flexible region masks and one or more scan images by aligning the scan images and the one or more MRD images at the identified set of alignment sites; and position the one or more flexible region masks on the scan images.

34 Claims, 8 Drawing Sheets

(51) Int. Cl.
  *G06T 7/00* (2017.01)
  *G03F 1/84* (2012.01)
  *H01L 21/66* (2006.01)
(52) U.S. Cl.
  CPC .............. *G03F 1/84* (2013.01); *H01L 22/12* (2013.01); *G06T 2207/30148* (2013.01)
(58) Field of Classification Search
  USPC .................................. 356/399–401; 382/149
  See application file for complete search history.

(56) References Cited

U.S. PATENT DOCUMENTS

| | | | | |
|---|---|---|---|---|
| 2007/0156379 | A1* | 7/2007 | Kulkarni | G06F 30/30 703/14 |
| 2007/0230770 | A1* | 10/2007 | Kulkarni | H01L 21/67005 382/149 |
| 2007/0288219 | A1* | 12/2007 | Zafar | G06T 7/0008 703/14 |
| 2010/0119144 | A1* | 5/2010 | Kulkarni | G06F 30/30 382/149 |
| 2014/0168418 | A1* | 6/2014 | Hess | G06T 7/001 348/126 |
| 2018/0003647 | A1 | 1/2018 | Sezginer et al. | |
| 2019/0139208 | A1 | 5/2019 | Chen et al. | |

OTHER PUBLICATIONS

PCT International Search Report and Written Opinion for International Application No. PCT/US2020/061399 dated Mar. 5, 2021, 7 pages.

\* cited by examiner

SYSTEM AND METHOD FOR DEFINING FLEXIBLE REGIONS ON A SAMPLE DURING INSPECTION

CROSS-REFERENCE TO RELATED APPLICATION

The present application claims priority to U.S. Provisional Application Ser. No. 62/944,118, filed Dec. 5, 2019, which is incorporated herein by reference in the entirety.

TECHNICAL FIELD

The present invention generally relates to the field of inspection systems, and, more particularly, to an inspection system configured to define irregularly shaped regions on a sample.

BACKGROUND

Demand for electronic logic and memory devices with ever-smaller footprints and features present a wide range of manufacturing challenges beyond fabrication at a desired scale. Semiconductor devices may develop defects during the fabrication processes. Inspection processes are performed at various steps during the manufacturing process to detect defects on a sample. In the context of semiconductor fabrication, accurately defining regions to be placed on scanned images is an important step in improving sensitivity and reducing nuisance. Conventional methods utilize a rectangular box format to define the regions. However, the rectangular box format is incapable of accurately defining areas with non-rectangular regions, which leads to inaccuracies and reduced sensitivity.

Therefore, it would be desirable to provide a system and method that cure the shortfalls of the previous approaches identified above.

SUMMARY

A system is disclosed, in accordance with one or more embodiments of the present disclosure. In one embodiment, the system includes an inspection sub-system configured to acquire one or more swath images. In another embodiment, the system includes a controller communicatively coupled to the inspection sub-system, the controller including one or more processors configured to execute program instructions causing the one or more processors to: generate one or more median reference die images based on one or more swath images acquired by an inspection sub-system; generate one or more flexible region masks based on the one or more median reference die images; identify a set of alignment sites on the one or more flexible region masks based on one or more coordinates of the one or more median reference die images; perform patch-to-mask alignment between the one or more flexible region masks and one or more scan images by aligning the one or more scan images and the one or more median reference die images at the identified set of alignment sites; and position the one or more flexible region masks on the one or more scan images.

A system is disclosed, in accordance with one or more embodiments of the present disclosure. In one embodiment, the system includes a controller including one or more processors configured to execute program instructions causing the one or more processors to: generate one or more median reference die images based on one or more swath images acquired by an inspection sub-system; generate one or more flexible region masks based on the one or more median reference die images; identify a set of alignment sites on the one or more flexible region masks based on one or more coordinates of the one or more median reference die images; perform patch-to-mask alignment between the one or more flexible region masks and one or more scan images by aligning the one or more scan images and the one or more median reference die images at the identified set of alignment sites; and position the one or more flexible region masks on the one or more scan images.

A method is disclosed, in accordance with one or more embodiments of the present disclosure. In one embodiment, the method includes generating one or more median reference die images based on one or more swath images acquired by an inspection sub-system. In another embodiment, the method includes generating one or more flexible region masks based on the one or more median reference die images. In another embodiment, the method includes identifying a set of alignment sites on the one or more flexible region masks based on one or more coordinates of the one or more median reference die images. In another embodiment, the method includes performing patch-to-mask alignment between the one or more flexible region masks and one or more scan images by aligning the one or more scan images and the one or more median reference die images at the identified set of alignment sites. In another embodiment, the method includes positioning the one or more flexible region masks on the one or more scan images.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

Figure 1A:
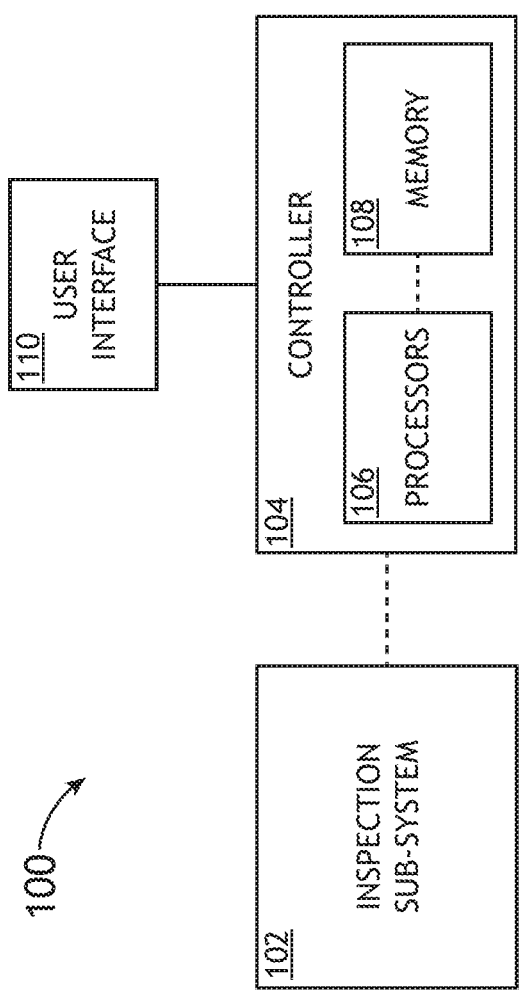
FIG. 1A illustrates a simplified block diagram of a system for defining flexible regions on a sample during inspection, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings.

In the context of semiconductor fabrication, accurately identifying and defining regions to be positioned on a scanned image during inspection is an important step in improving sensitivity. Region Based Multi-Thresholding. Region Based Multi-Thresholding is used to define different regions on a sample by a user during inspection recipe setup time. Each region is associated with a set of inspection parameters corresponding to the noise characteristics of that region. During inspection, the region definition will be placed on the scanned image and corresponding inspection parameters will be used for the best sensitivity and nuisance reduction. However, due to the capacity of computers and limitations of computer graphic technology, such regions are defined by the user manually using only a rectangular box format. The placement of the rectangular region boxes during inspection is inaccurate. The region boundaries are artificially dilated or shrunk based on the rule of "expanding region from noisy to less noisy regions" due to the stage uncertainty or local image jittering of the imaging system.

During advanced wafer level packaging (aWLP) inspection, the sample started to show structures with an increasing number of irregular shapes. The rectangular box format of the Region Based Multi-Theory did not accommodate the irregular shapes. Another approach was to generate inspection region maps to accommodate the irregular shapes. However, this approach was incapable of creating, storing, transferring and applying the irregular region mask in a reasonable way. The result was that the inspection image and corresponding region mask were being down sampled, which completely defeated the purpose of the inspection mask to accommodate the irregular shapes. This downsampling loses the native resolution and resulted in downgrading the sensitivity.

As the Internet of things (IoT) and Automotive industries have adopted more and more semiconductor integrated circuit (IC) chips, the IC chips have an increasing number of design rules (e.g., legacy design rules). In recent years, the patterns on the sample adopt non-rectangular shapes (e.g., irregular shapes) which are impossible to be grouped by rectangular regions using Region Based Multi-Thresholding. These irregular shapes are often found in aWLP areas, redistribution layer (RDL) lines, bumps, bond pads, through-silicon vias (TSVs), and the like. Inaccurate placement sacrifices the sensitivity/nuisance balance in inspection. Further, Region Based Multi-Thresholding places the rectangular region without any adjustment. The inspection needs to be able to separate redistribution layer (RDL) lines and any space between the RDL lines. These very thin lines (e.g., between <1 um to 4 um) are lithographically made to have horizontal, vertical, and diagonal orientations.

Embodiments of the present disclosure aim to cure one or more shortfalls of discussed above. Embodiments of the present disclosure are directed to a system and method to improve the sensitivity and suppress the nuisance in the legacy design rule wafer and aWLP wafer inspection. Specifically, embodiments of the present disclosure are directed to a system and method to enables the generation of flexible, irregular shaped region masks that can improve the sensitivity and lower the nuisance rate in both advanced legacy and advanced Wafer Level Packaging inspection. In lithographical wafer manufacturing, the inline inspection is performed by seeking the difference between the images of adjacent dies. On patterned wafers, because of different structures, the images may contain different noise characteristics on different areas of the die. With clear and accurate definition of such areas on a die, the defect inspection can be made more adaptive to the noise statistical characteristics, thus yielding more sensitive defect capture in less noisy areas and less nuisance in more noisy areas. The system and method utilize different information to assist in the generation/definition of such areas and how to position the area definition accurately on the scanned image during an inspection scan.

Referring generally to FIGS. 1A-6, a system and method for defining flexible regions on a sample during inspection is described, in accordance with one or more embodiments of the present disclosure.

FIG. 1A illustrates a system 100 for defining flexible regions on a sample, in accordance with one or more embodiments of the present disclosure. In particular, FIG. 1A illustrates a system 100 for defining flexible regions on a sample by generating a flexible region mask and positioning the flexible region mask on an image during inspection. The system 100 may include, but is not limited to, one or more inspection sub-systems 102. The system 100 may additionally include, but is not limited to, a controller 104 including one or more processors 106, memory 108, and a user interface 110.

The inspection sub-system 102 may include any inspection sub-system 102 known in the art including, but not limited to, an optical-based inspection system, a charged particle-based inspection system, and the like. For example, the inspection sub-system 102 may include an optical-based dark-field inspection system. By way of another example, the inspection sub-system may include an optical-based bright-field inspection system. By way of another example, the inspection sub-system 102 may include a scanning electron microscopy (SEM) inspection system. In one embodiment, the controller 104 is communicatively coupled to the one or more inspection sub-systems 102. In this regard, the one or more processors 106 of the controller 104 may be configured to generate one or more control signals configured to adjust one or more characteristics of the inspection sub-system 102.

Figure 1B:
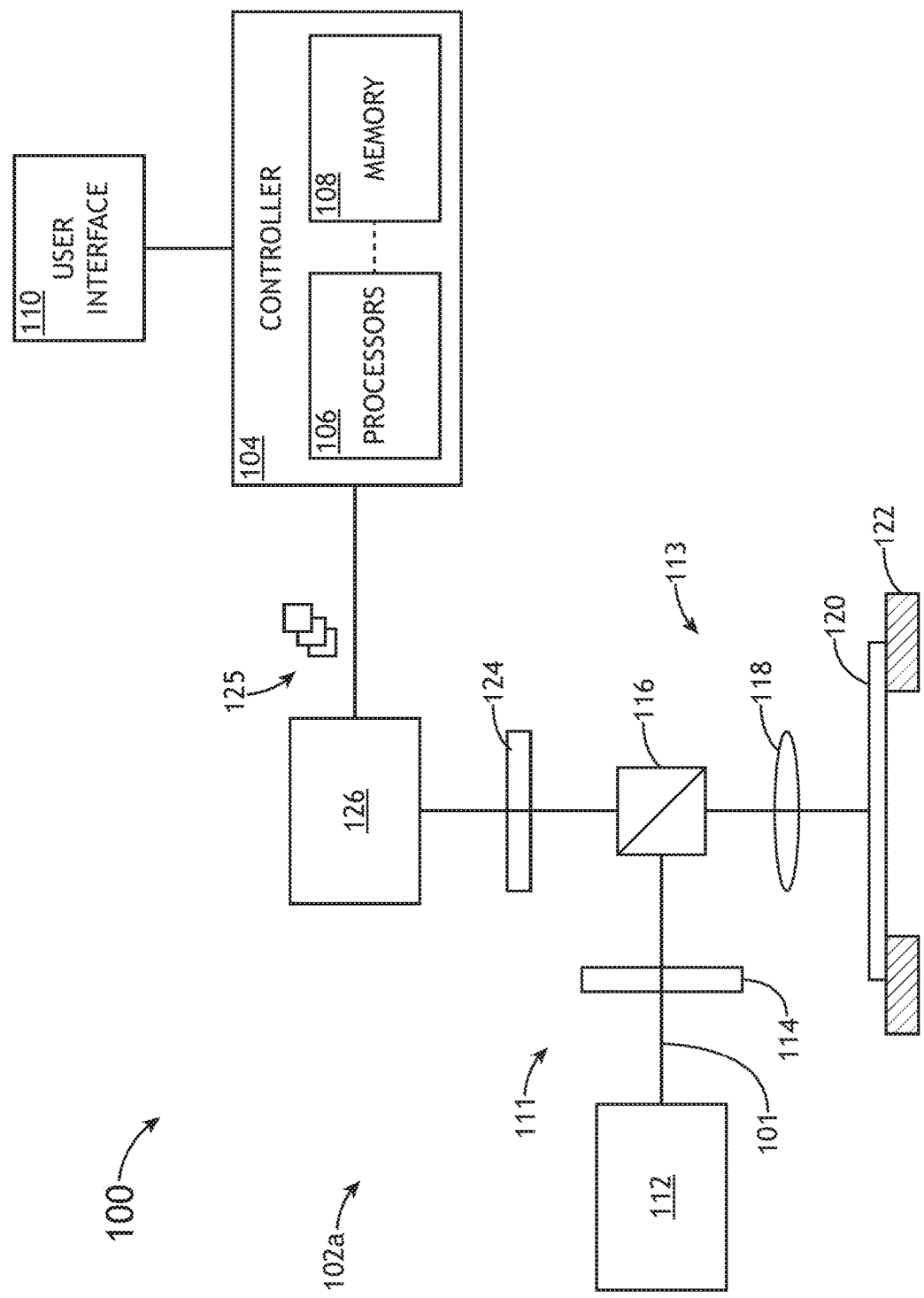
FIG. 1B illustrates a simplified schematic of an inspection sub-system of the system for defining flexible regions on a sample during inspection, in accordance with one or more embodiments of the present disclosure.

FIG. 1B illustrates a system 100 for defining a flexible region on sample, in accordance with one or more embodiments of the present disclosure. In particular, FIG. 1B illustrates a system 100 including an optical inspection sub-system 102*a*.

The optical inspection sub-system 102*a* may include any optical-based inspection system known in the art. For example, the inspection sub-system 102*a* may include an optical dark-field inspection tool. By way of another example, the inspection sub-system 102*a* may include an optical bright-field inspection tool. The optical inspection sub-system 102*a* may include, but is not limited to, an illumination source 112, an illumination arm 111, a collection arm 113, and a detector assembly 126.

In one embodiment, the optical inspection sub-system 102*a* is configured to inspect and/or measure the sample 120 disposed on the stage assembly 122. The illumination source 112 may include any illumination source known in the art for generating illumination 101 including, but not limited to, a broadband radiation source. In another embodiment, the optical inspection sub-system 102*a* may include an illumination arm 111 configured to direct illumination 101 to the sample 120. It is noted that the illumination source 112 of the optical inspection sub-system 102*a* may be configured in any orientation known in the art including, but not limited to, a dark-field orientation, a bright-field orientation, and the like. For example, the one or more optical elements 114, 124 may be selectively adjusted in order to configure the optical inspection sub-system 102*a* in a dark-field orientation, a bright-field orientation, and the like.

The sample 120 may include any sample known in the art including, but not limited to, a wafer, a reticle, a photomask, and the like. In one embodiment, the sample 120 is disposed on a stage assembly 122 to facilitate movement of the sample 120. In another embodiment, the stage assembly 122 is an actuatable stage. For example, the stage assembly 122 may include, but is not limited to, one or more translational stages suitable for selectively translating the sample 120 along one or more linear directions (e.g., x-direction, y-direction, and/or z-direction). By way of another example, the stage assembly 122 may include, but is not limited to, one or more rotational stages suitable for selectively rotating the sample 120 along a rotational direction. By way of another example, the stage assembly 122 may include, but is not limited to, a rotational stage and a translational stage suitable for selectively translating the sample 120 along a linear direction and/or rotating the sample 120 along a rotational direction. It is noted herein that the system 100 may operate in any scanning mode known in the art.

The illumination arm 111 may include any number and type of optical components known in the art. In one embodiment, the illumination arm 111 includes one or more optical elements 114, a set of one or more optical elements 115, a beam splitter 116, and an objective lens 118. In this regard, illumination arm 111 may be configured to focus illumination 101 from the illumination source 112 onto the surface of the sample 120. The one or more optical elements 114 may include any optical elements known in the art including, but not limited to, one or more mirrors, one or more lenses, one or more polarizers, one or more beam splitters, wave plates, and the like.

In another embodiment, the optical inspection sub-system 102*a* includes a collection arm 113 configured to collect illumination reflected or scattered from the sample 120. In another embodiment, the collection arm 113 may direct and/or focus the reflected and scattered light to one or more sensors of a detector assembly 126 via one or more optical elements 124. The one or more optical elements 124 may include any optical elements known in the art including, but not limited to, one or more mirrors, one or more lenses, one or more polarizers, one or more beam splitters, one or more wave plates, and the like. It is noted that detector assembly 126 may include any sensor and detector assembly known in the art for detecting illumination reflected or scattered from the sample 120 including, but not limited to, a charge coupled device (CCD), a complementary metal-oxide semiconductor (CMOS) device, a photomultiplier tube (PMT), a photodiode array, and avalanche photodiode (APD), a time delay integration (TDI) device, or the like.

In another embodiment, the detector assembly 126 of the optical inspection sub-system 102 is configured to collect inspection data of the sample 120 based on illumination reflected or scattered from the sample 120. In another embodiment, the detector assembly 126 is configured to transmit collected/acquired images and/or inspection data to the controller 104.

As noted previously herein, the controller 104 of system 100 may include one or more processors 106 and memory 108. The memory 108 may include program instructions configured to cause the one or more processors 106 to carry out various steps of the present disclosure. In one embodiment, the program instructions are configured to cause the one or more processors 106 to adjust one or more characteristics of the optical inspection sub-system 102 in order to perform one or more measurements of the sample 120.

In additional and/or alternative embodiments, the inspection sub-system 102 may include a charged particle-based inspection sub-system 102. For example, the inspection sub-system 102 may include an SEM inspection sub-system, as illustrated in FIG. 1C.

Figure 1C:
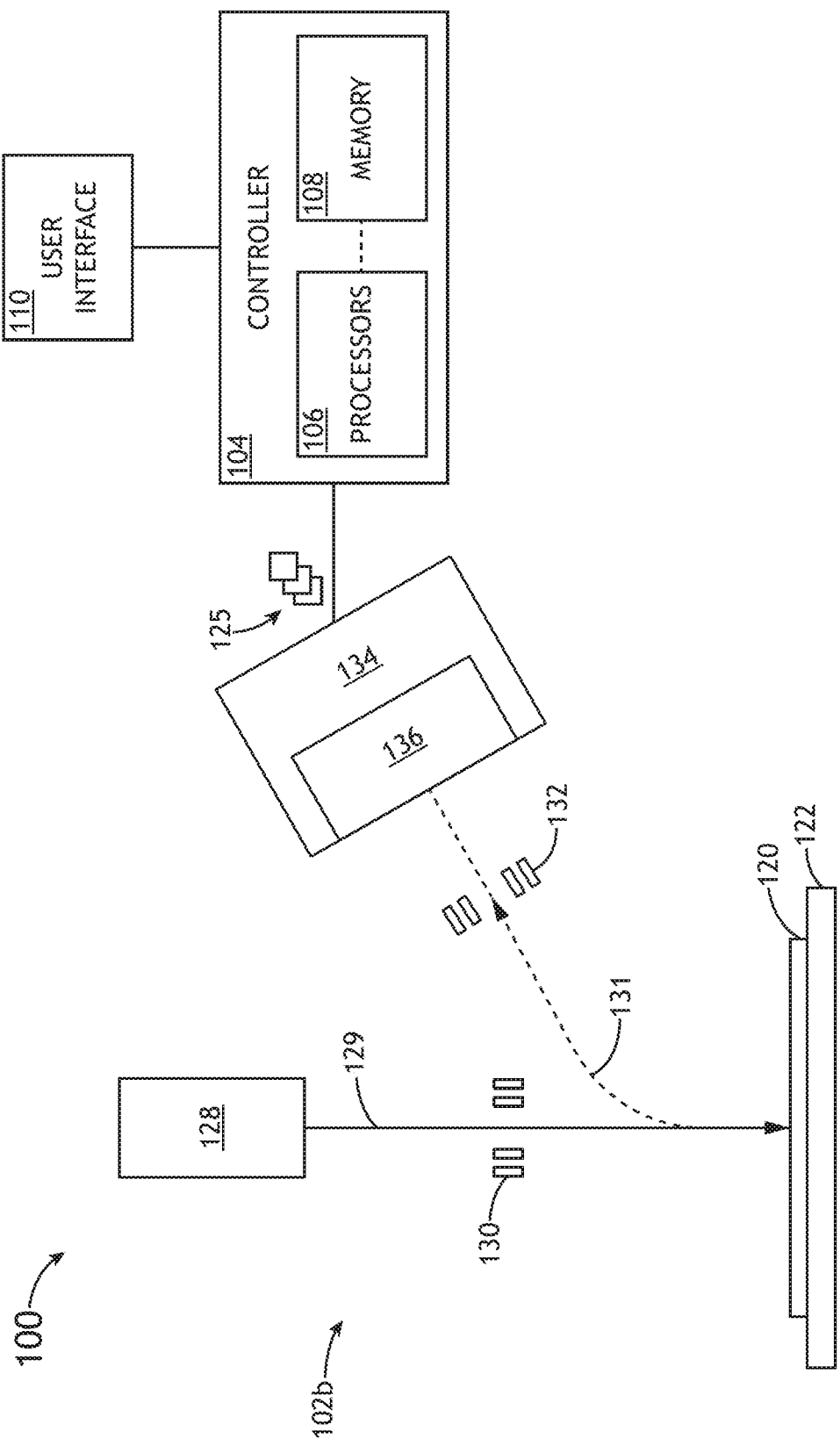
FIG. 1C illustrates a simplified schematic of an inspection sub-system of the system for defining flexible regions on a sample during inspection, in accordance with one or more embodiments of the present disclosure.

FIG. 1C illustrates a system 100 for defining a flexible region on a sample, in accordance with one or more embodiments of the present disclosure. In particular, FIG. 1C illustrates a system 100 including an SEM inspection sub-system 102*b*.

In one embodiment, the SEM inspection sub-system 102*b* is configured to perform one or more measurements on the sample 120. In this regard, the SEM inspection sub-system 102*b* may be configured to acquire one or more images of the sample 120. The SEM inspection sub-system 102*b* may include, but is not limited to, an electron beam source 128, one or more electron-optical elements 130, one or more electron-optical elements 132, and an electron detector assembly 134 including one or more electron sensors 136.

In one embodiment, the electron beam source 128 is configured to direct one or more electron beams 129 to the sample 120. The electron beam source 128 may form an electron-optical column. In another embodiment, electron beam source 128 includes one or more additional and/or alternative electron-optical elements 130 configured to focus and/or direct the one or more electron beams 129 to the surface of the sample 120. In another embodiment, the SEM inspection sub-system 102*b* includes one or more electron-optical elements 132 configured to collect secondary and/or backscattered electrons 131 emanated from the surface of the sample 120 in response to the one or more electron beams 129. It is noted herein that the one or more electron-optical elements 130 and the one or more electron-optical elements 132 may include any electron-optical elements configured to direct, focus, and/or collect electrons including, but not limited to, one or more deflectors, one or more electron-optical lenses, one or more condenser lenses (e.g., magnetic condenser lenses), one or more objective lenses (e.g., magnetic condenser lenses), and the like.

it is noted that the electron optical assembly of the SEM inspection sub-system 102*b* is not limited to the electron-optical elements depicted in FIG. 1C, which are provided merely for illustrative purposes. It is further noted that the system 100 may include any number and type of electron-optical elements necessary to direct/focus the one or more electron beams 129 onto the sample 120 and, in response, collect and image the emanated secondary and/or backscattered electrons 131 onto the electron detector assembly 134.

For example, the system 100 may include one or more electron beam scanning elements (not shown). For instance, the one or more electron beam scanning elements may include, but are not limited to, one or more electromagnetic scanning coils or electrostatic deflectors suitable for controlling a position of the one or more electron beams 129 relative to the surface of the sample 120. Further, the one or more scanning elements may be utilized to scan the one or more electron beams 129 across the sample 120 in a selected pattern.

In another embodiment, the secondary and/or backscattered electrons 131 are directed to one or more sensors 136 of the electron detector assembly 134. The electron detector assembly 134 of the SEM inspection sub-system 102 may include any electron detector assembly known in the art suitable for detecting backscattered and/or secondary electrons 131 emanating from the surface of the sample 120. In one embodiment, the electron detector assembly 134 includes an electron detector array. In this regard, the electron detector assembly 134 may include an array of electron-detecting portions. Further, each electron-detecting portion of the detector array of the electron detector assembly 134 may be positioned so as to detect an electron signal from sample 120 associated with one of the incident one or more electron beams 129. The electron detector assembly 134 may include any type of electron detector known in the art. For example, the electron detector assembly 134 may include a micro-channel plate (MCP), a PIN or p-n junction detector array, such as, but not limited to, a diode array or avalanche photo diodes (APDs). By way of another example, the electron detector assembly 134 may include a high-speed scintillator or a photomultiplier tube (PMT) detector.

While FIG. 1C illustrates the SEM inspection sub-system 102b as including an electron detector assembly 134 comprising only a secondary electron detector assembly, this is not to be regarded as a limitation of the present disclosure. In this regard, it is noted that the electron detector assembly 134 may include, but is not limited to, a secondary electron detector, a backscattered electron detector, and/or a primary electron detector (e.g., an in-column electron detector). In another embodiment, SEM inspection sub-system 102b may include a plurality of electron detector assemblies 134. For example, although not shown, the system 100 may include a secondary electron detector assembly 134a, a backscattered electron detector assembly 134b, and an in-column electron detector assembly 134c.

In one embodiment, the one or more processors 106 of the controller 104 are configured to analyze the output of detector assembly 126/electron detector assembly 134. In one embodiment, the set of program instructions are configured to cause the one or more processors 106 to analyze one or more characteristics of sample 120 based on images received from the detector assembly 126/electron detector assembly 134. For example, the set of program instructions are configured to cause the one or more processors 106 to analyze one or more characteristics of the sample 120 based on one or more swath images 125 received from the detector assembly 126 electron detector assembly 134. In another embodiment, the set of program instructions are configured to cause the one or more processors 106 to modify one or more characteristics of system 100 in order to maintain focus on the sample 120 and/or the detector assembly 126/electron detector assembly 134. For example, the one or more processors 106 may be configured to adjust one or more characteristics of the illumination source 112/electron beam source 128 and/or other elements of system 100 in order to focus the illumination 101 and/or one or more electron beams 129 onto the surface of the sample 120. By way of another example, the one or more processors 106 may be configured to adjust the one or more elements of system 100 in order to collect illumination and/or secondary electrons 131 from the surface of the sample 120 and focus the collected illumination on the detector assembly 126/electron detector assembly 134. By way of another example, the one or more processors 106 may be configured to adjust one or more focusing voltages applied to one or more electrostatic deflectors of electron beam source 128 in order to independently adjust the position or alignment of the one or more electron beams 129 and scan the electron beams 129 across the sample 120.

In another embodiment, as shown in FIGS. 1A-1C, system 100 includes a user interface 110 communicatively coupled to the controller 104. In another embodiment, the user interface 110 includes a user input device and a display. The user input device of the user interface 110 may be configured to receive one or more input commands from a user, the one or more input commands configured to input data into system 100 and/or adjust one or more characteristics of system 100. In another embodiment, the display of the user interface 110 may be configured to display data of system 100 to a user.

In one embodiment, the one or more processors 106 may be communicatively coupled to memory 108, wherein the one or more processors 106 are configured to execute a set of program instructions stored on memory 108, the set of program instructions configured to cause the one or more processors 106 to carry out various functions and steps of the present disclosure. In one embodiment, the controller 104 may be configured to: generate one or more median reference die (MRD) images based on one or more swath images acquired by an inspection sub-system. In another embodiment, the controller 104 may be configured to generate one or more flexible region masks based on the one or more MRD images. In another embodiment, the controller 104 may be configured to identify a set of alignment sites on the one or more flexible region masks based on one or more coordinates of the one or more MRD images. In another embodiment, the controller 104 may be configured to perform patch-to-mask alignment (PMA) between the one or more flexible region masks and one or more scan images by aligning the one or more scan images and the one or more MRD images at the identified set of alignment sites. In another embodiment, the controller 104 may be configured to position the one or more flexible region masks on the one or more scan images. Each of these steps/functions of the controller 104 will each be described in further detail herein.

It is noted herein that the one or more components of the disclosed system may be communicatively coupled to the various other components of the system in any manner known in the art. For example, the one or more components (e.g., controller 104, user interface 110, or the like) may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth and the like).

In one embodiment, the one or more processors 106 may include any one or more processing elements known in the art. In this sense, the one or more processors 106 may include any microprocessor-type device configured to execute software algorithms and/or instructions. In one embodiment, the one or more processors 106 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 106. In general, the term "processor" may be broadly defined to encompass any device having one or more processing elements, which execute program instructions from memory 108. Moreover, different subsystems of the system 100 may include processor or logic elements suitable for carrying out at least a portion of the steps described throughout the present disclosure. Therefore, the above description should not be interpreted as a limitation on the present disclosure but merely an illustration.

The memory 108 may include any storage medium known in the art suitable for storing program instructions executable by the associated one or more processors 106 and the data received from the transmitting devices. For example, the memory 108 may include a non-transitory memory medium. For instance, the memory 108 may include, but is not limited to, a read-only memory (ROM), a random access memory (RAM), a magnetic or optical memory device (e.g., disk), a magnetic tape, a solid state drive and the like. In another embodiment, the memory 108 is configured to store data including, but not limited to, entity data, association data (e.g., spatial relationship data), operations data, GPS data, time-stamped data, geo-fenced data, and the like received from transmitting devices. It is further noted that memory 108 may be housed in a common controller housing with the one or more processors 106. In an alternative embodiment, the memory 108 may be located remotely with respect to the physical location of the processors 106, controller 104, and the like. In another embodiment, the memory 108 maintains program instructions for causing the one or more processors 106 carry out the various steps described through the present disclosure.

In one embodiment, a user interface 110 is communicatively coupled to the controller 104. In one embodiment, the user interface 110 may include, but is not limited to, one or more desktops, tablets, smartphones, smart watches, or the like. In another embodiment, the user interface 110 includes a display used to display data of the system 100 to a user. The display of the user interface 110 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 110 is suitable for implementation in the present disclosure. In another embodiment, a user may input selections and/or instructions responsive to data displayed to the user via the user interface 110.

Figure 2:
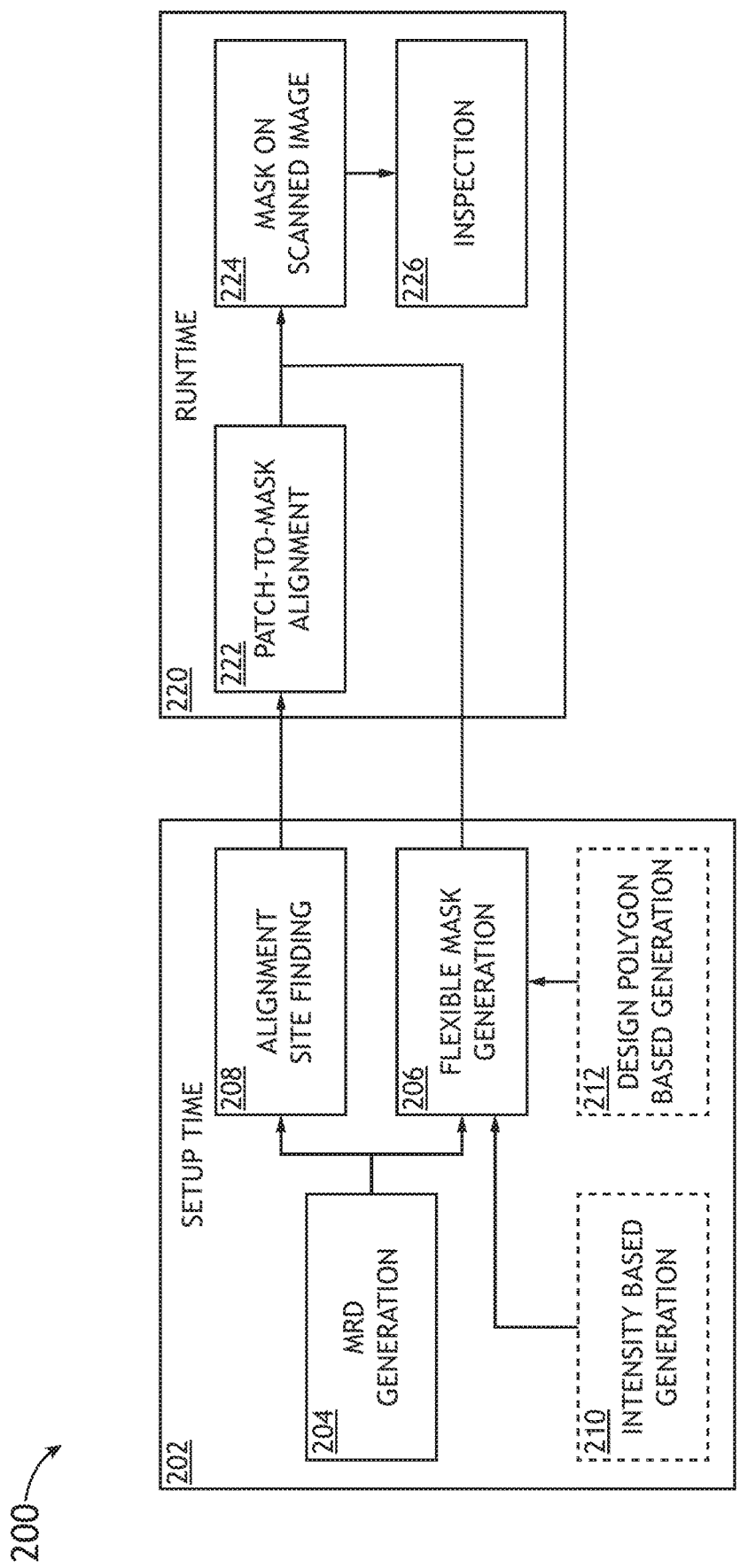
FIG. 2 illustrates a flow chart for defining flexible regions on a sample during inspection, in accordance with one or more embodiments of the present disclosure.

FIG. 2 illustrates a flow chart 200 for defining a flexible region on a sample during inspection, in accordance with one or more embodiments of the present disclosure. In particular, FIG. 2 illustrates the flow chart 200 including a setup time portion 202 and a runtime portion 220.

During setup time 202, one or more median reference die (MRD) images may be generated (step 204). In one embodiment, the one or more MRD images may be generated based on one or more swath images 125 acquired from an inspection sub-system (e.g., inspection sub-system 102 shown in FIGS. 1B-1C). For example, the controller 104 of the system 100 may be configured to acquire the one or more swath images 125 generated by the inspection sub-system 102. For instance, the one or more swath images 125 may be acquired from a predefined set of dies in a die row on the sample 120. In this regard, the one or more swath images may be acquired from three adjacent dies. It is noted herein that the one or more MRD images may be acquired in a similar (or substantially similar) optics mode and pixel size that the inspection will be performed with. For example, after the inspection optics mode (e.g., light wavelength, polarization mode, pixel size, or the like) is determined, a similar (or substantially similar) optics mode will be used to acquire the one or more MRD images.

In one embodiment, the controller 104 is configured to generate one or more horizontally aligned swath images. For example, the controller 104 may be configured to perform a horizontal alignment of the three adjacent die frames to generate the one or more horizontally aligned swath images.

In another embodiment, the controller 104 is configured to determine a median intensity of the one or more horizontally aligned swath images. For example, a median intensity may be determined based on the corresponding pixels among the three adjacent die swath frames that have been horizontally aligned.

In another embodiment, the controller 104 is configured to generate one or more vertically aligned swath images based on the median intensity. For example, the controller 104 may be configured to perform a vertical alignment of the one or more swath images to generate the one or more aligned swath images. For instance, adjacent die swath image frames may include overlapping areas in a vertical direction and the overlapping area may be used to perform alignment offset estimation (e.g., integer pixel plus sub-pixel offset).

In another embodiment, the controller 104 is configured to perform interpolation. For example, the controller 104 may be configured to perform interpolation to apply the alignment offset estimation (in sub-pixel accuracy) to the one or more aligned swath images before stitching occurs.

In another embodiment, the controller 104 is configured to stitch the one or more aligned swath images with adjacent one or more aligned swath images to generate the one or more MRD images.

During setup time 202, one or more flexible region masks may be generated based on the one or more MRD images (step 206). In one embodiment, the controller 104 is configured to load the one or more MRD images. For example, the controller 104 may be communicatively coupled to a user interface device 110, such that a user can easily define one or more flexible region masks using associated one or more region identifiers at each pixel level. In this regard, the user interface device 110 may display a graphical user interface (e.g., GUI 300) to aid a user in generating the one or more flexible region mask.

Figure 3:
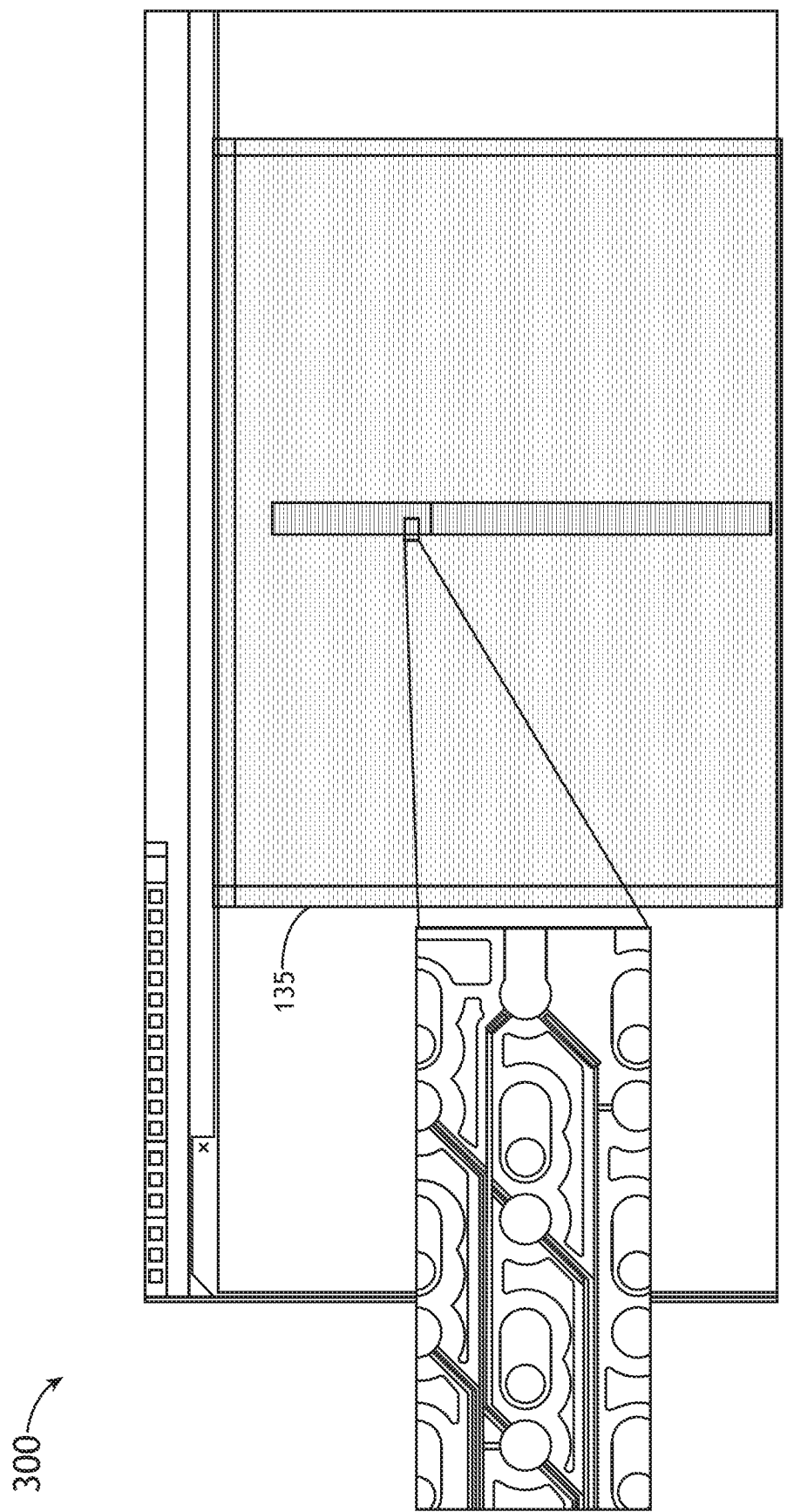
FIG. 3 illustrates a simplified schematic of a graphical user interface (GUI) to perform mask generation, in accordance with one or more embodiments of the present disclosure.

FIG. 3 illustrates an exemplary graphical user interface (GUI) 300 to perform mask generation, in accordance with one or more embodiments of the present disclosure.

In one embodiment, the one or more MRD images are loaded into the controller 104. For example, the one or more MRD images may be loaded and displayed to a user via a user interface 110. For instance, the one or more loaded MRD images may be used to generate the one or more flexible region masks. After the loading of the one or more MRD images, the user can simply use the user input device of the user interface device 110 to drag the one or more MRD images in one or more directions. Further, the user may use the user input device to adjust the magnification of the one or more MRD images. In this regard, a user may zoom in and/or out on different portions of the one or more MRD images, as shown in FIG. 3.

In one embodiment, the GUI 300 is configured to allow a user to easily define one or more areas to perform flexible region mask generation. For example, a user may easily define one or more rectangular areas to perform the flexible region mask generation.

In one embodiment, the one or more flexible region masks are generated based on intensity differentiation of different pattern structures on the one or more MRD images (step 210). For example, an intensity histogram analysis may be used to determine one or more intensity cut lines to differentiate the one or more pattern structures into one or more regions of pixel level. In this regard, a user may assign one or more region identifiers to each of the one or more regions of pixel level to generate the one or more flexible region masks.

In another embodiment, the system 100 includes a set of features that are configured to aid a user in generating the one or more flexible region masks. For example, the one or more processors 106 of the system 100 may include a replicate function. For instance, repeating structures may be assigned a similar one or more region identifies using the replicate function. In this regard, the user only needs to spend time defining flexible region masks for one unit and use the replication function to propagate the region mask onto other repeating areas through using the simple correlation function. By way of another example, the one or more processors 106 may include one or more morphological operations. For instance, the one or more processors 106 may include a dilution operation. In another instance, the one or more processors 106 may include an erosion operation. By way of a further example, the GUI 300 of the system 100 may include one or more paint features. In this regard, where intensities are poorly separated from nearby structures, the one or more paint features may enable differentiation of the intensities to generate the one or more flexible region masks. By way of another example, the system 100 may include one or more editing functions. For instance, the GUI 300 of the system 100 may include, but are not limited to, an erase function, a redo function, an undo function, and the like.

It is noted herein that only the areas on the die that are desirable to be inspected will be generated the one or more region identifiers at each pixel level. In this regard, those areas which are not desirable to be inspected will be ignored (e.g., the region identifier will be 0).

Figure 4:
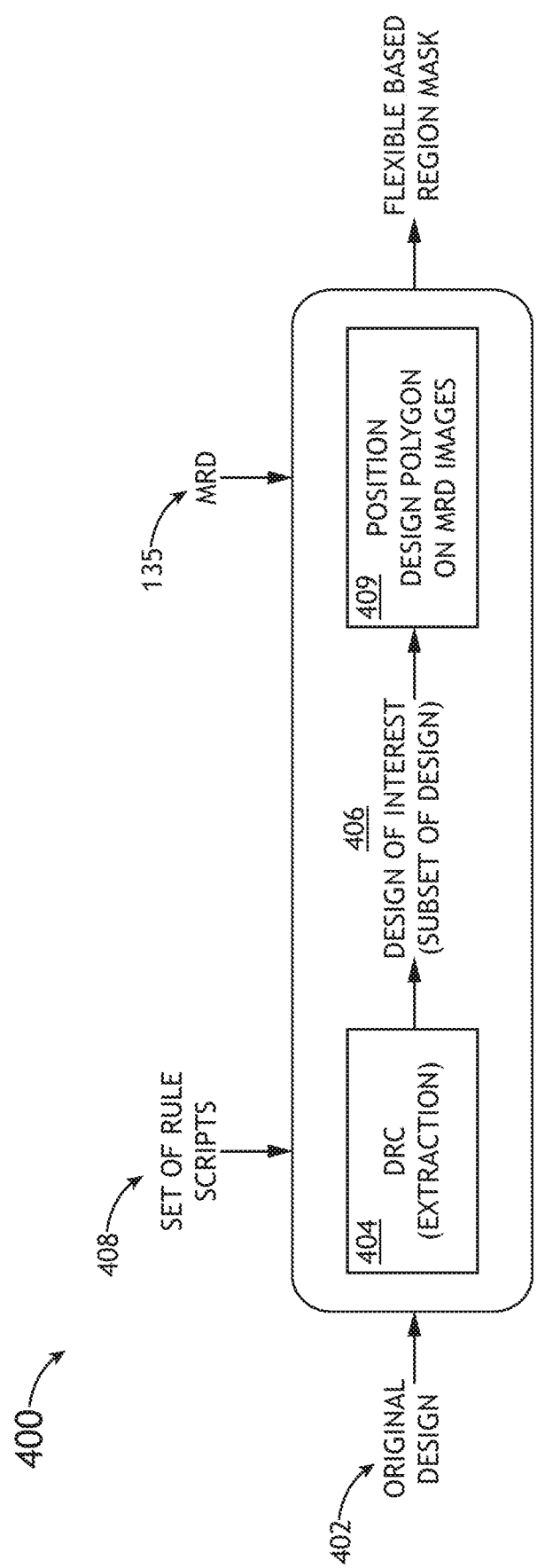
FIG. 4 illustrates a flow chart for design-based mask generation, in accordance with one or more embodiments of the present disclosure.

FIG. 4 illustrates a flow chart 400 for design-based mask generation of the one or more flexible region masks, in accordance with one or more embodiments of the present disclosure.

In one embodiment, the one or more flexible region masks are generated based on design polygon information of the pattern structures of the die (step 212).

In step 402, one or more the design files are acquired. The one or more design files may be provided in any format known in the art. For example, the one or more design files may be in a Graphic Data Stream (GDS) format. By way of another example, the one or more design files may be in an Open Artwork System Interchange Standard (OASIS) format. In one embodiment, the one or more design files are loaded onto the controller 104. For example, the one or more processors 106 of the controller 104 may utilize a Design Rule Check (DRC) software to load and visualize the one or more design files.

In step 404, one or more desired flexible region masks are extracted from the one or more design files. For example, the one or more desired flexible region masks may be extracted in polygons (to generate one or more polygon flexible region mask) using the DRC software. In this regard, the one or more desired flexible region masks may be stored in memory 108 in GDS/OASIS format as a new file.

In step 406, one or more desired layers in the one or more design files are selected. Since inspection is only performed on certain interested structures, a set of rule scripts 408 may be developed. The set of rule scripts 408 may be developed to facilitate the extraction of certain structures in polygon format. Further, the set of rule scripts 408 may be used to add one or more polygons to fill one or more structures. For example, spaces between redistribution layer (RDL) lines may be filled with the one or more polygons.

In step 409, the one or more polygon flexible region masks are positioned on the one or more MRD images 135. In one embodiment, the one or more MRD images 135 and the one or more polygon flexible region masks are loaded into the one or more processors 106 of the controller 104. In another embodiment, a user can utilize the GUI 300 to adjust the magnification of the one or more MRD images 135.

In one embodiment, the one or more polygon flexible region masks are aligned with the one or more MRD images. For example, a user may manually align and scale the one or more polygon flexible region masks with the one or more MRD images 135 using the GUI 300. By way of another example, the one or more MRD images 135 and the one or more polygon flexible region masks may be automatically aligned and scaled to achieve the Design Polygon to MRD alignment. For instance, a grid-based alignment approach may be used to achieve the design polygon to MRD alignment. In this regard, a grid on a design structure of the die may be defined. Further, one or more alignment offsets may be defined at the intersections of the grid between the MRD image and the design structures on the die. Further, the one or more flexible region masks may be generated on the one or more MRD images using the alignment offset interpolation on the grid. It is noted herein that the grid-based align approach may be capable of handling large distortion, and even non-continuous system distortion without heavy computing cost.

In another instance, the aligning of the one or more polygon flexible region masks on the one or more MRD images is performed using deep-learning-based alignment. In a further instance, the aligning of the one or more polygon flexible region masks on the one or more MRD images is performed using physics model-based alignment. It is noted herein that any model-based alignment technique may be used including, but not limited to, near field optics model-based rendering, ray-tracing rending and alignment, or the like.

In one embodiment, the one or more flexible region masks may be configured to be defined based on the design polygons. In another embodiment, the one or more flexible region masks may be defined on one or more different design layers as different care area types. In another embodiment, the one or more flexible region masks may be defined using the one or more morphology operations.

It is noted herein that for Ease-of-Use, a user can work on one subset of the design polygon and save as GDS/Oasis files individually. Then the DRC may load all subsets of the GDS/Oasis and integrate into a combined GDS/Oasis file to be saved as the final design polygon to align with the MRD in step 408. Further, the one or more intensity-based masks may be loaded and integrated with the design polygons loaded from the GDS/Oasis files.

Referring back to FIG. 2, as the one or more flexible region masks are generated, a set of alignment sites associated with the areas-to-be-inspected may be identified (step 208). In one embodiment, the set of alignment sites are identified based on one or more coordinates of the one or more MRD images. For example, the set of alignment sites may be identified near or inside the one or more flexible region masks based on the one or more coordinates of the one or more MRD images. For instance, an alignment engine may be configured to run through the one or more MRD images frames and identify a set of alignment sites with a normalized cross-correlation score. In another embodiment, the set of alignment sites are stored with the one or more MRD images and the one or more flexible region masks on memory 108. In this regard, the file path name may be stored in the inspection recipe.

In one embodiment, one or more alignment site scores are calculated. For example, an alignment site score for each alignment site of the set of alignment sites may be calculated to indicate the appropriateness of being an alignment site. For example, an alignment site with a periodic structure may have a low score. By way of another example, an alignment site with a unique structure may have higher score then the alignment site with the periodic structure.

During runtime 220, the identified set of alignment sites are used to perform patch-to-mask alignment (PMA) (step 222). In one embodiment, the PMA is performed between the one or more flexible region masks and one or more scan images. For example, the one or more scan images and the one or more MRD images may be aligned at the identified set of alignment sites. In this regard, for each image frame set, the system 100 may utilize the identified set of alignment sites to perform the PMA between the portion of the one or more MRD images and the one or more scan images.

In one embodiment, an alignment shift between the identified set of alignment sites and the one or more scan images are determined. For example, a corresponding set of alignment sites for the one or more scan images may be determined based on the identified set of alignment sites on the one or more MRD images.

In another embodiment, one or more inspection job alignment sites are acquired.

In another embodiment, the one or more inspection job alignment sites are aligned with adjacent inspection job alignment sites in an inspection system.

In another embodiment, an alignment shift is calculated between the inspection job alignment sites and the inspection frame. For example, the alignment shift may be a shift offset in the X and Y direction. For instance, multiple alignment sites in the inspection frame may provide sufficient statistics to calculate a maximum likelihood estimate of the shift offset in the X and Y direction.

In another embodiment, the one or more flexible region masks with a pixel size similar to a pixel size of the one or more scan images are replaced.

Once the shift is determined, the one or more flexible region masks are positioned on the one or more scan images for inspection (step 224). For example, the determined shift may be used to accurately position the one or more flexible region masks on the one or more scan images. It is noted herein that the region mask and the alignment sites are from the same MRD images. In this regard, a shift between the MRD image and the runtime frame is equal to the shift between the region mask and the runtime frame.

It is noted herein that inspection Runtime Alignment (RTA) may also be performed to align the left and right job frames toward the center job frame before the noise statistics and inspection is performed based on the die-to-die or single-die inspection algorithms.

Once the one or more flexible masks are positioned on the one or more scan images, inspection may be performed (226). For example, segment-based die-to-die inspection may performed. By way of another example, segment based single die inspection may be performed.

Figure 5:
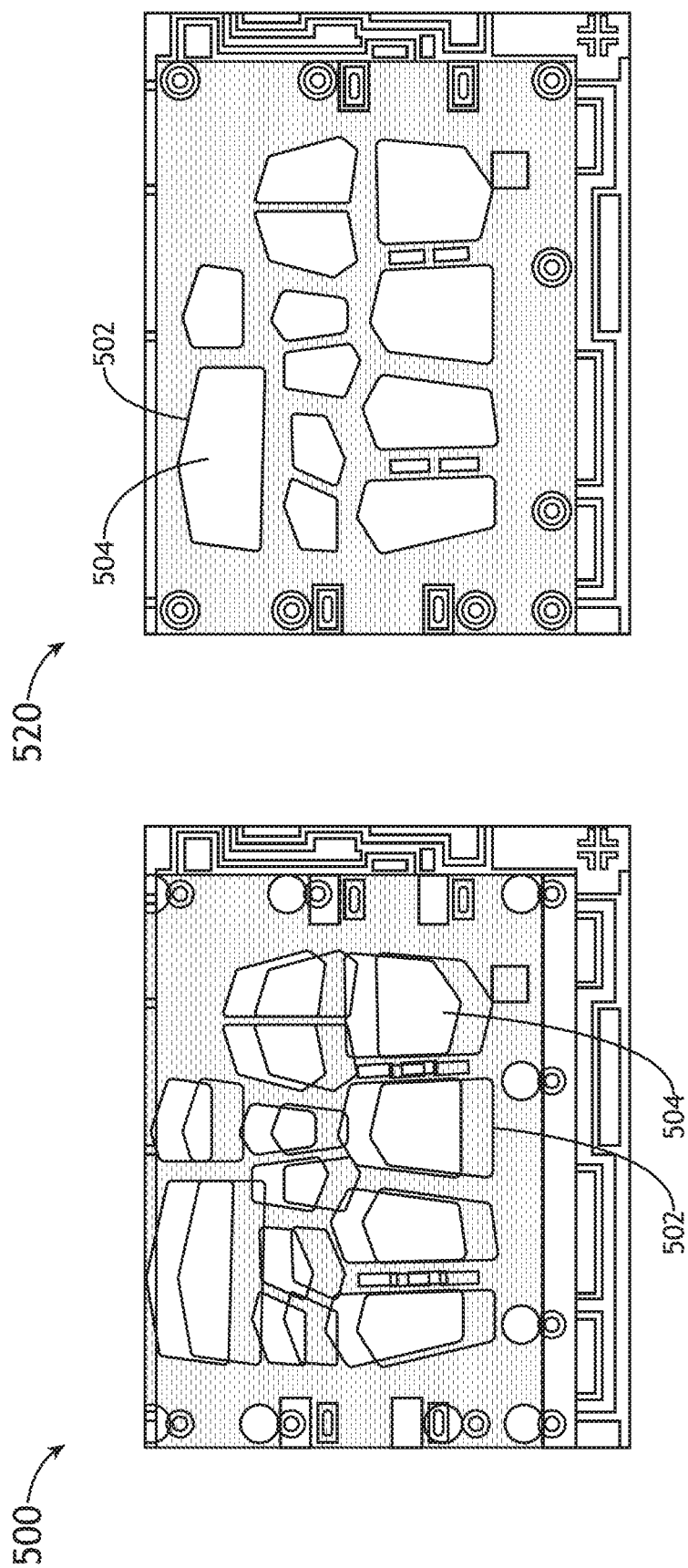
FIG. 5 is a comparison of accurate mask placement and inaccurate mask placement, in accordance with one or more embodiments of the present disclosure.

FIG. 5 is a comparison of accurate mask placement and inaccurate mask placement, in accordance with one or more embodiments of the present disclosure. It is noted herein that the PMA process is a key component to ensure accurate placement of the region mask during inspection runtime.

In one embodiment, the PMA utilizes the alignment sites selected during MRD image generation. Since the alignment sites are directly selected from the MRD image associated with the region mask, the alignment shift calculated between the alignment sites (selected from the one or more MRD images) and the runtime one or more scan images represents the shift between the one or more flexible region masks and the one or more scan images. Further, the alignment sites are selected specific to a small area (e.g., 512×512 pixel), to enhance the local placement accuracy. At inspection runtime, the alignment sites in each inspection unit (we call job) are collected and applied to correlate (or aligned) with the corresponding sites in the inspection frame. The shift between alignment sites and runtime frames are calculated. They are used accurately replace the region mask up to a single pixel level.

As shown in FIG. 5, the PMA process is configured to allow for accurate placement of the one or more flexible region masks 502 on the one or more scan images. For example, an inaccurate placement 500 will occur when the one or more flexible region masks 502 are not positioned on the design polygons 504 of the one or more scan images. By way of another example, an accurate placement 520 will occur when the one or more flexible region masks 502 are positioned on the design polygons 504 of the one or more scan images.

Figure 6:
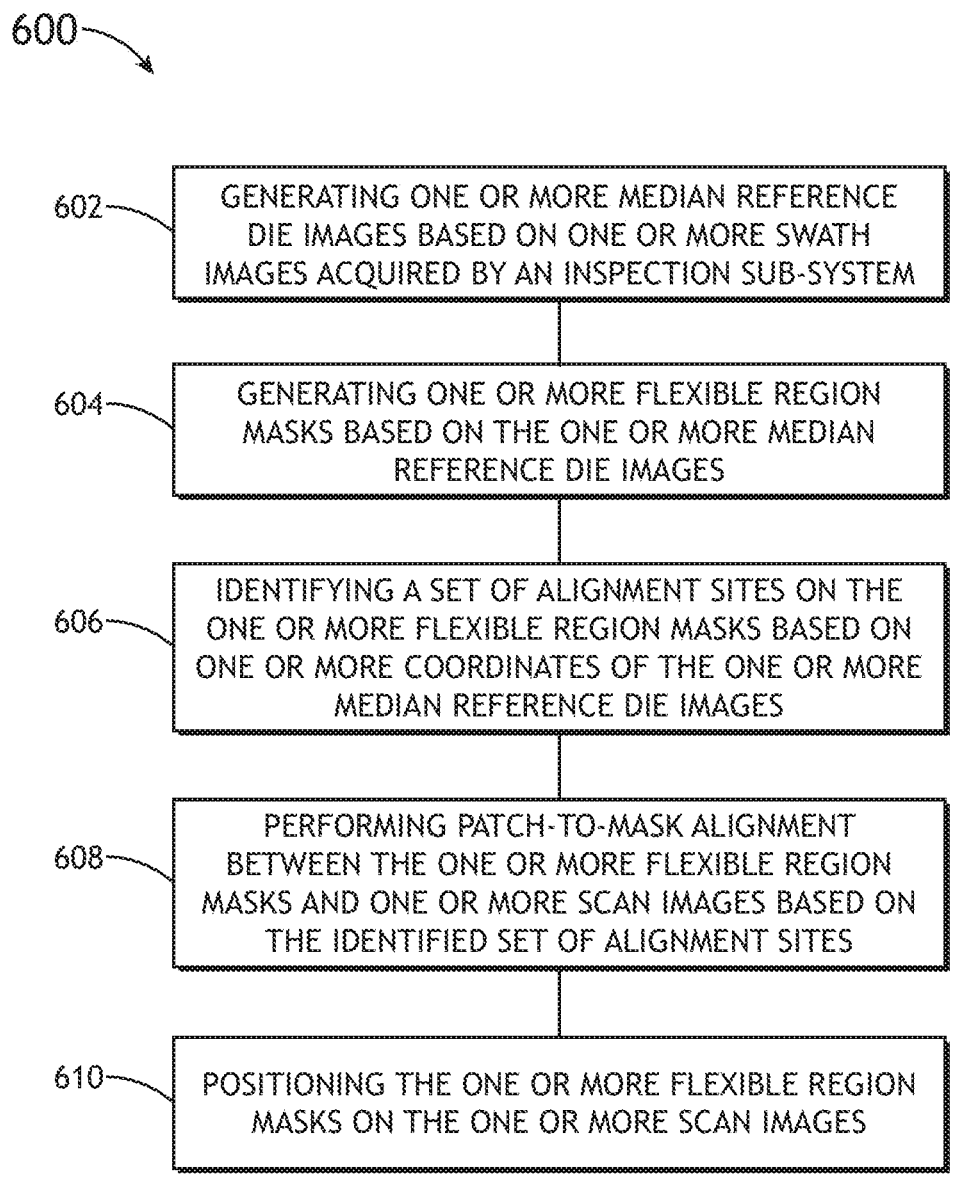
FIG. 6 illustrates a flow chart of a method defining flexible regions on a sample during inspection, in accordance with one or more embodiments of the present disclosure.

FIG. 6 illustrates a flowchart of a method 600 for defining flexible regions on a sample during inspection, in accordance with one or more embodiments of the present disclosure. It is noted herein that the steps of method 600 may be implemented all or in part by system 100. It is further recognized, however, that the method 600 is not limited to the system 100 in that additional or alternative system-level embodiments may carry out all or part of the steps of method 600.

In step 602, one or more median reference die (MRD) images are generated based on one or more swath images acquired by an inspection sub-system. For example, the controller 104 may be configured to acquire the one or more swath images 125 generated by the inspection sub-system 102. For instance, the one or more swath images 125 may be acquired from three adjacent dies.

In one embodiment, controller 104 is configured to generate one or more horizontally aligned swath images. For example, the controller 104 may be configured to perform a horizontal alignment of the one or more swath images to generate the one or more horizontally aligned swath images. For instance, the controller 104 may be configured to perform a horizontal alignment of the three adjacent die frames to generate the one or more horizontally aligned swath images.

In another embodiment, the controller 104 is configured to determine a median intensity of the one or more horizontally aligned swath images. For example, a median intensity may be determined based on the corresponding pixels among the three adjacent die swath frames that have been horizontally aligned.

In another embodiment, the controller 104 is configured to generate one or more vertically aligned swath images based on the median intensity. For example, the controller 104 may be configured to perform a vertical alignment of the one or more swath images to generate the one or more aligned swath images. For instance, adjacent die swath image frames may include overlapping areas in a vertical direction and the overlapping area may be used to perform alignment offset estimation (e.g., integer pixel plus sub-pixel offset).

In another embodiment, the controller 104 is configured to stitch the one or more aligned swath images with adjacent one or more aligned swath images to generate the one or more MRD images.

In step 604, one or more flexible region masks are generated based on the one or more MRD images. In one embodiment, the one or more flexible region masks are generated based on intensity differentiation of different pattern structures on the one or more MRD images. In another embodiment, the one or more flexible region masks are generated based on design polygon information of the pattern structures on the die.

In step 606, a set of alignment sites on the one or more flexible region masks are identified based on one or more coordinates of the one or more MRD images. For example, the set of alignment sites may be identified near or inside the one or more flexible region masks based on the one or more coordinates of the one or more MRD images. For instance, an alignment engine may be configured to run through the one or more MRD images frames and identify a set of alignment sites with a normalized cross-correlation score. In another embodiment, the set of alignment sites may be configured to be stored with the one or more MRD images and the one or more flexible region masks in memory 108. In this regard, the set of alignment sites, the one or more MRD images, and one or more flexible region masks may be used in the inspection recipe.

In step 608, patch-to-mask alignment (PMA) is performed between the one or more flexible region masks and one or more scan images based on the identified set of alignment sites. In one embodiment, the one or more scan images are one or more TDI line scan images. For example, the inspection sub-system 102 may be configured acquire the one or more TDI line scan images.

In step 610, the one or more flexible region masks are positioned on the one or more scan images. As shown in FIG. 5, accurate placement of the flexible region mask on the scan images is critical to improve sensitivity.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory 108. The results may include any of the results described herein and may be stored in any manner known in the art. The memory 108 may include any memory 108 described herein or any other suitable storage medium known in the art. After the results have been stored, the results can be accessed in the memory 108 and used by any of the method or system embodiments described herein, formatted for display to a user, used by another software module, method, or system, and the like. Furthermore, the results may be stored "permanently," "semi-permanently," temporarily," or for some period of time. For example, the memory 108 may be random access memory (RAM), and the results may not necessarily persist indefinitely in the memory 108.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can

What is claimed:

1. A system, comprising:
an inspection sub-system configured to acquire one or more swath images; and
a controller communicatively coupled to the inspection sub-system, the controller including one or more processors configured to execute program instructions causing the one or more processors to:
generate one or more median reference die images based on the one or more swath images acquired by the inspection sub-system;
generate one or more flexible region masks based on the one or more median reference die images;
identify a set of alignment sites on the one or more flexible region masks based on one or more coordinates of the one or more median reference die images;
perform patch-to-mask alignment between the one or more flexible region masks and one or more scan images by aligning the one or more scan images and the one or more median reference die images at the identified set of alignment sites; and
position the one or more flexible region masks on the one or more scan images.

2. The system of claim 1, wherein the generate one or more median reference die images based on the one or more swath images acquired by the inspection sub-system comprises:
performing a horizontal alignment of the one or more swath images to generate one or more vertically aligned swath images;
determining a median intensity of the one or more horizontally aligned swath images
performing a vertical alignment of the one or more horizontally aligned swath images to generate one or more aligned swath images; and
stitching the one or more aligned swath images with an adjacent one or more aligned swath images to generate the one or more median reference die images.

3. The system of claim 1, wherein the generate one or more flexible region masks based on the one or more median reference die images is based on intensity differentiation of different pattern structures on the one or more median reference die images.

4. The system of claim 1, wherein the generate one or more flexible region masks based on the one or more median reference die images is based on design polygon information of different pattern structures of a die.

5. The system of claim 4, wherein the generate one or more flexible region masks based on the one or more median reference die images based on design polygon information of different pattern structures of a die comprises:
extracting desired one or more flexible region masks in polygons;
positioning the one or more polygon flexible region masks on the one or more median reference die images; and
aligning the one or more polygon flexible region masks on the one or more median reference die images.

6. The system of claim 5, wherein the aligning the one or more polygon flexible region masks on the one or more median reference die images is performed using grid-based alignment.

7. The system of claim 6, wherein the grid-based alignment comprises:
defining a grid on a design structure of a die;
calculating alignment offsets at one or more intersections of the grid between the one or more median reference die images and the design structure of the die; and
generating the one or more flexible region masks on the one or more median reference die images using interpolation of the alignment offset on the grid.

8. The system of claim 5, wherein the aligning the one or more polygon flexible region masks on the one or more median reference die images is performed using deep-learning-based alignment.

9. The system of claim 5, wherein the aligning the one or more polygon flexible region masks on the one or more median reference die images is performed using physics model-based alignment.

10. The system of claim 9, wherein the physics model-based alignment includes near field optics model-based rendering or ray-tracing rendering and alignment.

11. The system of claim 1, wherein the identify a set of alignment sites on the one or more flexible region masks comprises generating an alignment score.

12. The system of claim 11, wherein the identify a set of alignment sites on the one or more flexible region masks comprises generating a low alignment score for an alignment site with a periodic structure.

13. The system of claim 11, wherein the identify a set of alignment sites on the one or more flexible region masks comprises generating a high alignment score for an alignment site with a unique structure.

14. The system of claim 1, wherein the perform patch-to-mask alignment between the one or more flexible region masks and one or more scan images based on the identified set of alignment sites comprises:
determining an alignment shift between the identified set of alignment sites and the one or more scan images;
acquiring one or more inspection job alignment sites;
aligning the one or more inspection job alignment sites with adjacent inspection job alignment sites in an inspection frame;
calculating an alignment shift between the inspection job alignment sites and inspection frame; and
replacing the one or more flexible region masks with a pixel size similar to a pixel size of the one or more scan images.

15. The system of claim 1, wherein the determined alignment shift between the identified set of alignment sites and the one or more scan images represents a shift between the one or more flexible region masks and the one or more scan images.

16. The system of claim 1, wherein the inspection sub-system includes an advanced wafer level packaging inspection sub-system.

17. The system of claim 1, wherein the one or more scan images are one or more time delay integration line scan images.

18. A system, comprising:
a controller including one or more processors configured to execute program instructions causing the one or more processors to:
generate one or more median reference die images based on one or more swath images acquired by an inspection sub-system;
generate one or more flexible region masks based on the one or more median reference die images;
identify a set of alignment sites on the one or more flexible region masks based on one or more coordinates of the one or more median reference die images;
perform patch-to-mask alignment between the one or more flexible region masks and one or more scan images by aligning the one or more scan images and the one or more median reference die images at the identified set of alignment sites; and
position the one or more flexible region masks on the one or more scan images.

19. The system of claim 18, wherein the generate one or more median reference die images based on the one or more swath images acquired by the inspection sub-system comprises:
performing a horizontal alignment of the one or more swath images to generate one or more vertically aligned swath images;
determining a median intensity of the one or more horizontally aligned swath images
performing a vertical alignment of the one or more horizontally aligned swath images to generate one or more aligned swath images; and
stitching the one or more aligned swath images with an adjacent one or more aligned swath images to generate the one or more median reference die images.

20. The system of claim 18, wherein the generate one or more flexible region masks based on the one or more median reference die images is based on intensity differentiation of different pattern structures on the one or more median reference die images.

21. The system of claim 18, wherein the generate one or more flexible region masks based on the one or more median reference die images is based on design polygon information of different pattern structures of a die.

22. The system of claim 21, wherein the generate one or more flexible region masks based on the one or more median reference die images based on design polygon information of different pattern structures of a die comprises:
extracting desired one or more flexible region masks in polygons;
positioning the one or more polygon flexible region masks on the one or more median reference die images; and
aligning the one or more polygon flexible region masks on the one or more median reference die images.

23. The system of claim 22, wherein the aligning the one or more polygon flexible region masks on the one or more median reference die images is performed using grid-based alignment.

24. The system of claim 23, wherein the grid-based alignment comprises:
defining a grid on a design structure of a die;
calculating alignment offsets at one or more intersections of the grid between the one or more median reference die images and the design structure of the die; and
generating the one or more flexible region masks on the one or more median reference die images using interpolation of the alignment offset on the grid.

25. The system of claim 22, wherein the aligning the one or more polygon flexible region masks on the one or more median reference die images is performed using deep-learning-based alignment.

26. The system of claim 22, wherein the aligning the one or more polygon flexible region masks on the one or more median reference die images is performed using model-based alignment.

27. The system of claim 18, wherein the identify a set of alignment sites on the one or more flexible region masks comprises generating an alignment score.

28. The system of claim 27, wherein the identify a set of alignment sites on the one or more flexible region masks comprises generating a low alignment score for an alignment site with a periodic structure.

29. The system of claim 27, wherein the identify a set of alignment sites on the one or more flexible region masks comprises generating a high alignment score for an alignment site with a unique structure.

30. The system of claim 18, wherein the perform patch-to-mask alignment between the one or more flexible region masks and one or more scan images based on the identified set of alignment sites comprises:
   determining an alignment shift between the identified set of alignment sites and the one or more scan images;
   acquiring one or more inspection job alignment sites;
   aligning the one or more inspection job alignment sites with adjacent inspection job alignment sites in an inspection frame;
   calculating an alignment shift between the inspection job alignment sites and inspection frame; and
   replacing the one or more flexible region masks with a pixel size similar to a pixel size of the one or more scan images.

31. The system of claim 18, wherein the determined alignment shift between the identified set of alignment sites and the one or more scan images represents a shift between the one or more flexible region masks and the one or more scan images.

32. The system of claim 18, wherein the inspection sub-system includes an advanced wafer level packaging inspection sub-system.

33. The system of claim 18, wherein the one or more scan images are one or more time delay integration line scan images.

34. A method, comprising:
   generating one or more median reference die images based on one or more swath images acquired by an inspection sub-system;
   generating one or more flexible region masks based on the one or more median reference die images;
   identifying a set of alignment sites on the one or more flexible region masks based on one or more coordinates of the one or more median reference die images;
   performing patch-to-mask alignment between the one or more flexible region masks and one or more scan images by aligning the one or more scan images and the one or more median reference die images at the identified set of alignment sites; and
   positioning the one or more flexible region masks on the one or more scan images.

* * * * *